United States Patent [19]
Estakhri et al.

[11] Patent Number: 5,818,781
[45] Date of Patent: Oct. 6, 1998

[54] AUTOMATIC VOLTAGE DETECTION IN MULTIPLE VOLTAGE APPLICATIONS

[75] Inventors: Petro Estakhri, Pleasanton; Mahmud Assar, Morgan Hill; Boyd Gayle Pett, San Jose, all of Calif.

[73] Assignee: Lexar, Fremont, Calif.

[21] Appl. No.: 748,867

[22] Filed: Nov. 13, 1996

Related U.S. Application Data

[60] Provisional application No. 60/006,478 Nov. 13, 1995.

[51] Int. Cl.$^6$ .................................................. G11C 16/06
[52] U.S. Cl. ...................... 365/226; 365/227; 365/189.09
[58] Field of Search ..................................... 365/226, 227, 365/228, 229, 189.06, 189.09, 189.11

[56] References Cited

U.S. PATENT DOCUMENTS 5,596,532  1/1997  Cernea et al. ........................... 365/226
5,671,179  9/1997  Javanifard ................................ 365/226
5,694,360  12/1997  Iizuka et al. ............................. 365/226

Primary Examiner—Vu A. Le
Attorney, Agent, or Firm—Claude A. S. Hamrick; Oppenheimer W. Donnelly; Maryam Imam

[57] ABSTRACT

A computer card including a voltage detection circuit having Flash EEPROM devices and a controller device, the voltage detection circuit further including a variable voltage detector for determining the system voltage level provided by a power supply within the computer product and appropriately enabling a voltage regulator circuit for dividing the system voltage level to a level suited for operation by the Flash EEPROM devices and applying this operational voltage level to the Flash EEPROM devices. Upon determining the system voltage level provided by the power supply to be appropriately suited for operation of the Flash EEPROM devices, disabling the voltage regulator circuit and providing the system voltage level to the Flash EEPROM devices.

14 Claims, 7 Drawing Sheets

AUTOMATIC VOLTAGE DETECTION IN MULTIPLE VOLTAGE APPLICATIONS

BACKGROUND OF THE INVENTION

CROSS REFERENCE TO RELATED APPLICATIONS

This is an application of our prior provisional application Ser. No. 60/006,478 filed Nov. 13, 1995 with the United States Patent and Trademarks Office, entitled "AUTOMATIC VOLTAGE DETECTION IN MULTIPLE VOLTAGE APPLICATIONS".

1. Field of the Invention

The present invention relates generally to detecting the voltage level of an input voltage source for use in systems, such as battery-operated personal computers (PCs), providing multiple voltage sources from a power supply and more particularly the present invention detects the voltage level of an input voltage source provided to a controller chip within a computer system wherein the present invention provides an appropriate voltage level based upon the detected input voltage for use by electrical circuits to perform functional operations.

2. Description of the Prior Art

Most of today's computers or PCs operate at 5.0 Volts±10% voltage levels provided by the PC's power supply unit. There has however, been a growing trend in the computer industry for operation of PC's at other than 5V levels, such as 3.3V. Designers of electronic components, namely Integrated Circuits (ICs), for PCs must design these components to be operational at any one of multiple voltage levels in order to meet various PC or system design requirements. For example, to reduce power consumption which is a highly desirable goal particularly in portable computers such as notebook, lap-top or palm-top PCs, the computer industry has been led to designs that are operational at lower voltages, i.e. 3.3 volts (V)±10%. Yet the use of 5V as the voltage level of a power supply source remains a requirement due to various system and device constraints.

More recently, with the advent of the popularity of portable computers, electronic components and devices that operate at lower voltages and consume less power have become very desirable to designers of such portable computers. This has led to the need for electronic components to be operational at 3 to 3.6 volts or the equivalent of three battery cells which are common and readily available to consumers.

Portable PC systems offer a wide variety of flexibility in terms of expansion of features such as additional memory, modem, etc. which may be purchased in the form of a PC card and plugged into the PC either at the time the PC is manufactured or later when a card is purchased separately by the consumer (these PC cards are sometimes referred to as plug-in cards). These PC cards include electronic components such as ICs and they are now designed to operate at 3.3 or 5 V because they incorporate ICs and other electronic components requiring the such voltage levels as their source of power supply input. The first non-volatile storage devices (Flash EEPROM devices) were designed to operate with two distinct voltage levels, namely 5V and 12V, due to the limitations of the first Flash EEPROM devices' in operating only at these two supply voltages.

A high-level block diagram of one of the first PCs to utilize solid state cards is shown in FIG. 1. In FIG. 1, a series of Flash EEPROM ICs are coupled to a controller device 12 which communicates to a host (not shown) through the host interface 14. The Flash EEPROMs 10 and the controller 12 generally reside on a solid state PC card that plugs into a PC and communicates with the host through the interface 14. The controller receives a 5V voltage level source from the power supply unit of the PC system while the Flash EEPROMs receive 5V and 12V from the controller 12, both of which are shown in sources 13 in FIG. 1. The 12V voltage source is generated by the controller 12.

In later designs however, Flash EEPROM design required a single 5V supply voltage FIG. 2 shows a high-level block diagram of such a PC card used in a PC environment incorporating such Flash EEPROMs. This card only works in a 5V PC system.

More recent Flash EEPROMs are designed to operate at 3.3V. FIG. 3 shows a PC system using such 3.3V Flash EEPROMs. Although such a system as shown in FIG. 3, requires 3.3V to be provided to its Flash EEPROM devices as input voltage source and therefore can not operate with a 5V source. In the same manner, the 5V system of FIG. 2 is only operational with a 5V supply source provided to the Flash EEPROM devices. Yet, it is desirable to design a system that supports either a 3.3V or 5V operation, i.e. either voltage may be supplied to a PC card effectively operating under either voltage. Moreover, the PCMCIA which is one of a number of industry-defined host interface standards and is defined and followed by the PC industry-at-large specifies certain requirements for communicating through the PCMCIA interface and includes, as a part of its requirements, a PCMCIA PC card to be operational either at 3.3V or 5V.

Following compliance with the PCMCIA standard, PC card manufacturers have recently designed their cards to operate either at a single 5V supply voltage or at dual 5V and 3.3V supply voltages. Having both kinds of cards however, presented a risk of damaging PC cards that were designed to run with only 3.3V and were susceptible to being inserted in PC slots providing 5V. This problem was resolved by a more recent PCMCIA standard requirement calling for physically keying the PC cards to uniquely fit into a particular PC slot. In this manner, a PC card requiring 3.3V is designed to fit specifically into a PC PCMCIA slot that provides only 3.3V supply and will therefore not fit into a PC PCMCIA slot providing a 5V supply. This avoids any potential damage to devices residing on the PC card that are operational only at 3.3V.

More recently, the PCMCIA standard has been revised to further require that cards designed to work with 5V (these cards incorporate Flash EEPROMs that can operate under 5V) while designed to be keyed as 5V cards, may be inserted into a 3.3V-keyed socket.

If so, the 5V voltage source will be transformed to 3.3V. FIG. 4 shows such a PC system wherein 3.3V Flash EEPROM devices reside in a card that only operates in a PC system providing 5V outputs due to the physically-keying structure of the card. The 5V supply voltage provided by the system is translated into 3.3V by the step-down voltage regulator 16 for use by the Flash EEPROM devices 10. But if a PC card having 5V EEPROM devices and therefore requiring 5V source voltage levels is inserted in the same slot, there will be no need to use the voltage regulator 16. In fact, the PC card is likely not to operate if the 5V source was converted to 3.3V. Therefore, the need arises for detection of voltage levels supplied by a PC system's power supply in order to determine whether the use of a voltage regulator is necessary. It is further desirable to selectably provide a first and second voltage sources to electronic circuitry such as Flash EEPROM devices in order to prevent damage to such circuitry resulting from the application of the wrong voltage.

Accordingly, the need exists for the detection of voltage levels provided from a power supply source(s) within PC systems, capable of supplying multiple voltage levels, to PC cards employing Flash EEPROM devices.

SUMMARY OF THE INVENTION

It is therefore a principal object of the present invention to provide a voltage detection device for enabling operation of electronic circuitry within a computer system wherein multiple voltage levels are available by automatically determining the voltage level being provided by the computer system and appropriately adjusting the voltage level for use by the electronic circuitry.

Another object of the present invention is to provide a system of the type described herein to detect the voltage level of a power supply source being provided by the computer system and to determine whether the voltage level is appropriate for non-volatile storage devices such as Flash EEPROM devices employed by the system and to provide the detected voltage level if it is appropriate for use by the Flash EEPROM devices and if not to translate the voltage level to that which is appropriate for use by the Flash EEPROM devices.

It is yet another object of the present invention to provide a system of the type described herein which uses a voltage regulator circuit to divide the system voltage source before applying it to Flash EEPROM devices.

Still another object of the present invention is to provide a system for performing detection of the system voltage level using a voltage detector circuitry.

It is a further object of the present invention to provide a system of the type described herein for determining the appropriate voltage level to provide to Flash EEPROM devices by applying a divided system voltage level to the Flash EEPROM devices while they undergo functional operations and upon unsuccessful results of such functional operations, applying the system voltage level to the Flash EEPROM devices, thereby eliminating the need for a voltage detection circuitry.

It is another object of the present invention to provide a detection circuitry for determining whether the voltage level provided by a PC system is 3.3V or 5V and upon such a determination applying the system voltage level to a solid state card incorporated within the PC system if the system voltage level is 3.3V and if the system voltage level is 5.0V, translating this voltage to 3.3V and applying the translated voltage to the solid state card.

Briefly, a preferred embodiment of the present invention includes a voltage detection circuit incorporated within a PC card having Flash EEPROM devices and a controller device, the voltage detection circuit further including a variable voltage detector for determining the system voltage level provided by a power supply within the PC product and appropriately enabling a voltage regulator circuit for dividing the system voltage level to a level suited for operation by the Flash EEPROM devices and applying this operational voltage level to the Flash EEPROM devices. Upon determining the system voltage level provided by the power supply to be appropriately suited for operation of the Flash EEPROM devices, disabling the voltage regulator circuit and providing the system voltage level to the Flash EEPROM devices.

These and other objects and advantages of the present invention will no doubt become apparent to those skilled in the art after having read the following detailed description of the preferred embodiments illustrated in the several figures of the drawing.

IN THE DRAWING

DETAILED DESCRIPTION OF THE PREFERRED EMBODIMENTS

Figure 1:
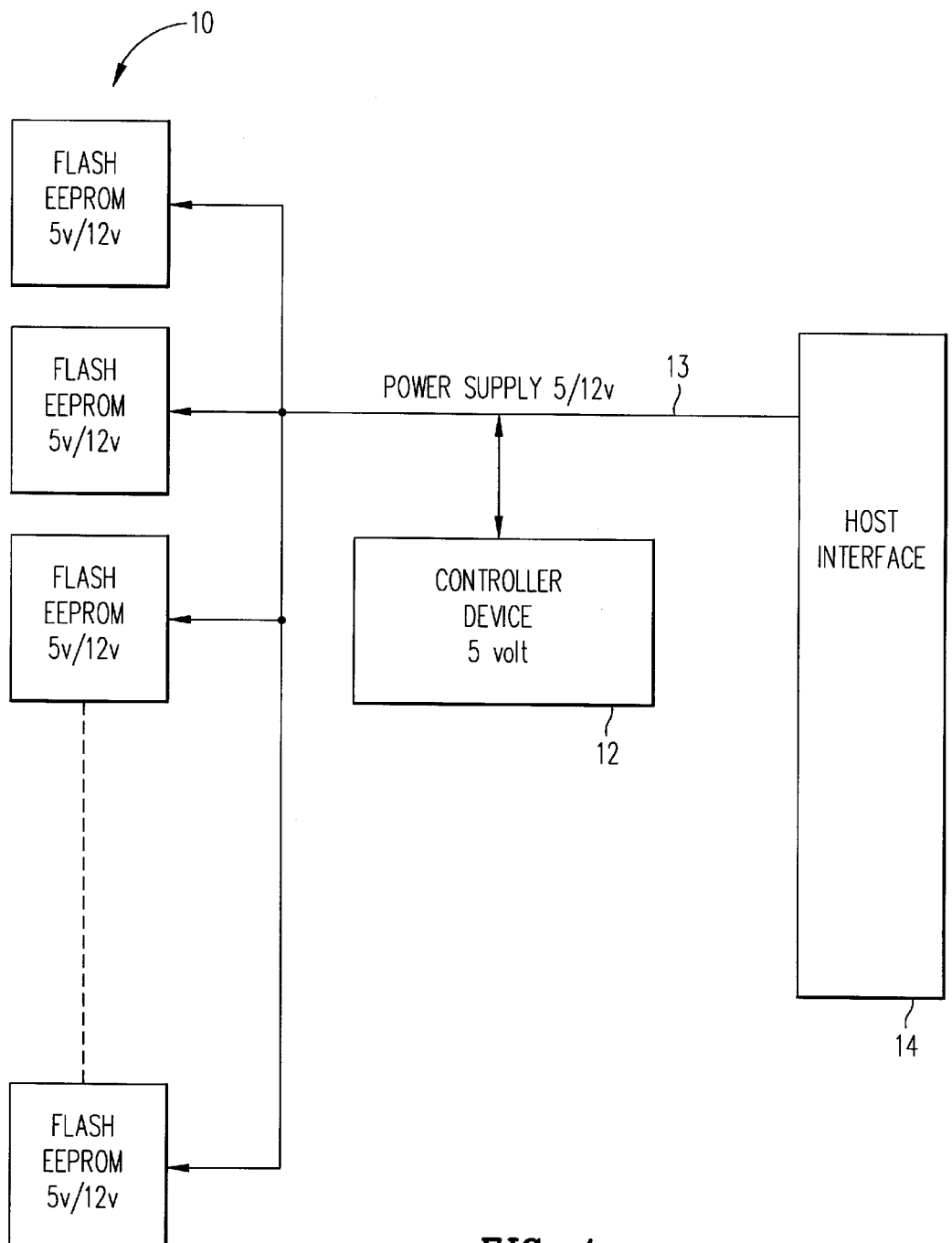
FIG. 1 illustrates a high-level block diagram of a prior art PC system wherein Flash EEPROM devices operational at 5V and 12V are employed.
Figure 2:
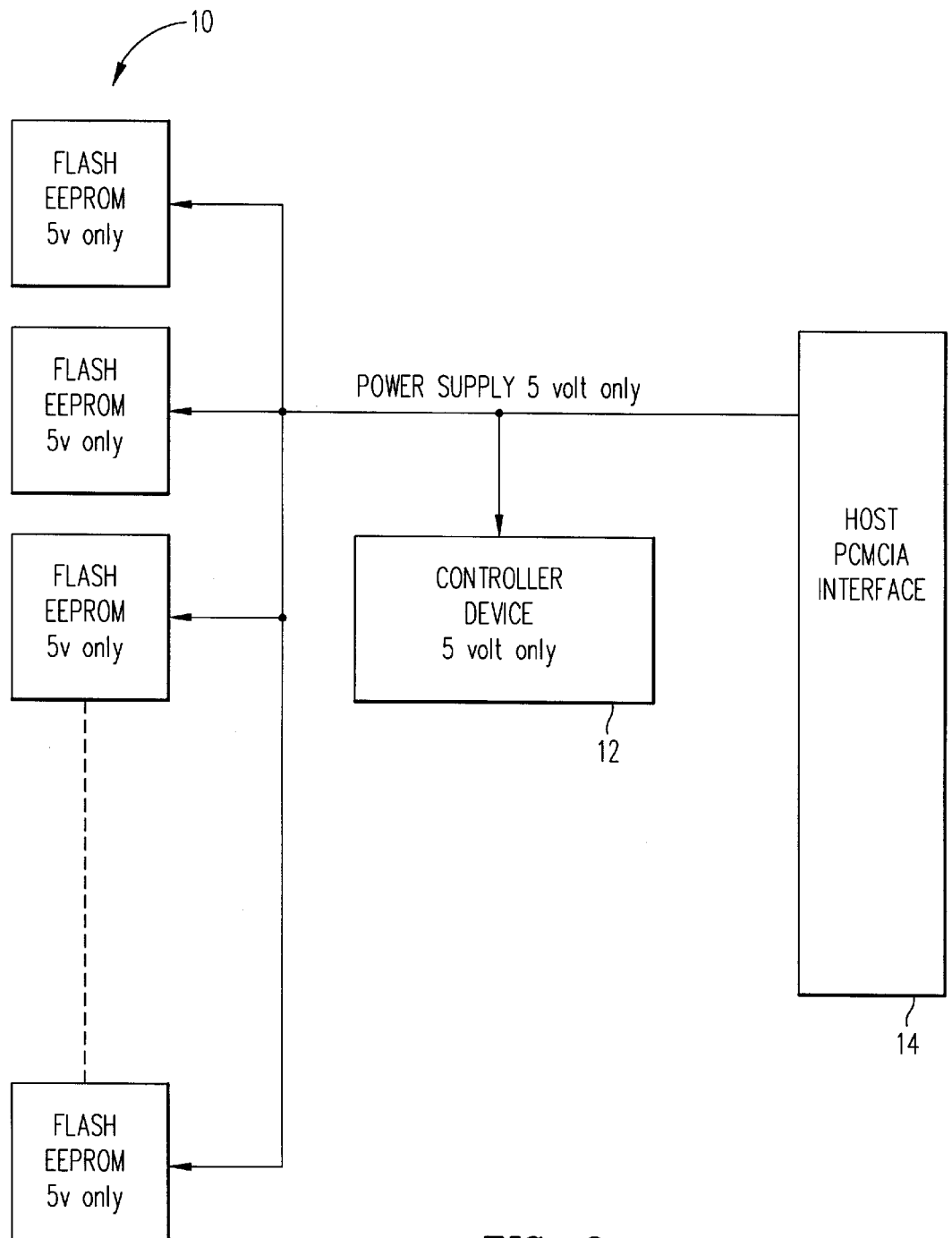
FIG. 2 shows another high-level block diagram of a prior art PC system employing Flash EEPROM devices operational only at 5V.
Figure 3:
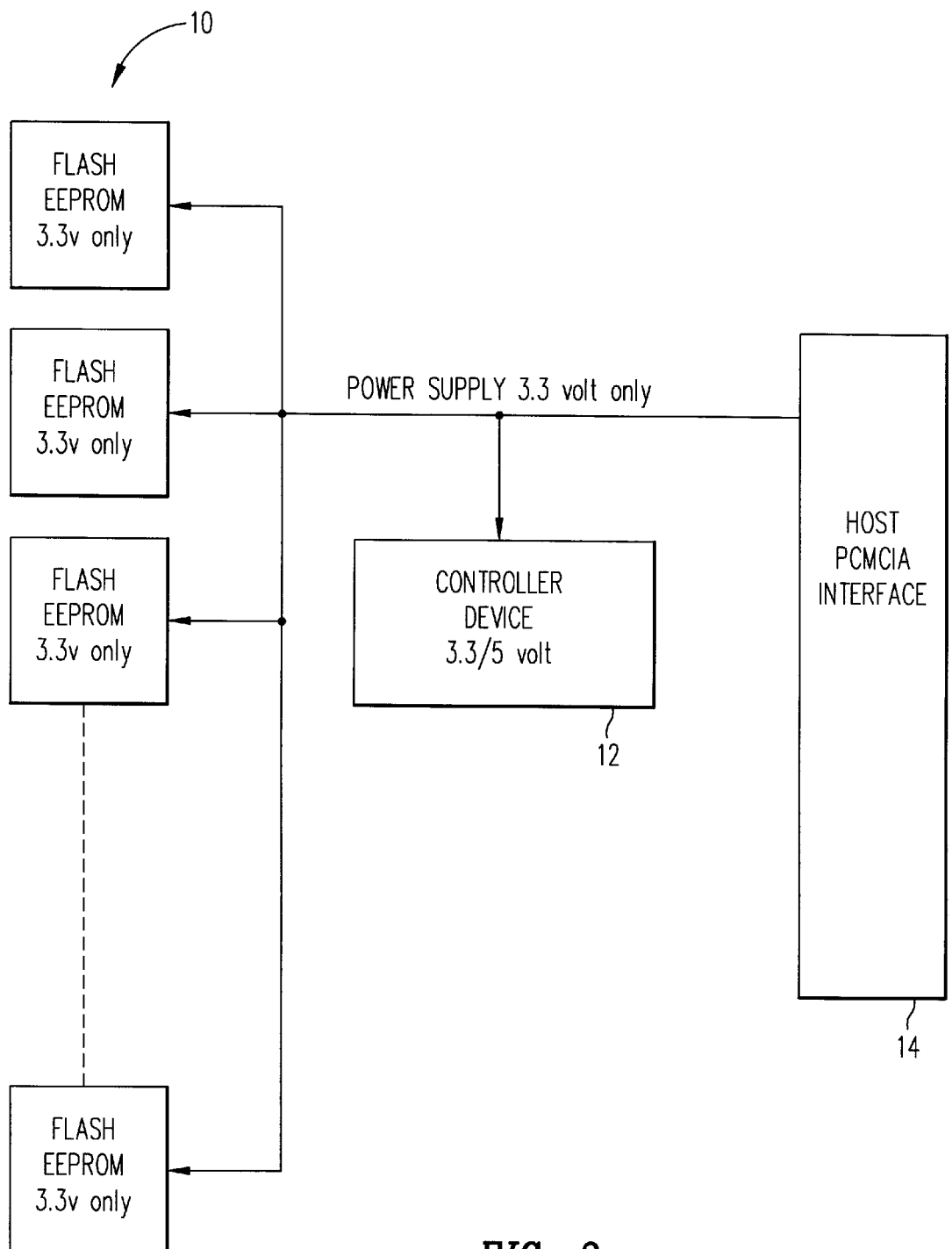
FIG. 3 shows yet another high-level block diagram of a prior art PC system employing Flash EEPROM devices operational only at 3.3V.
Figure 4:
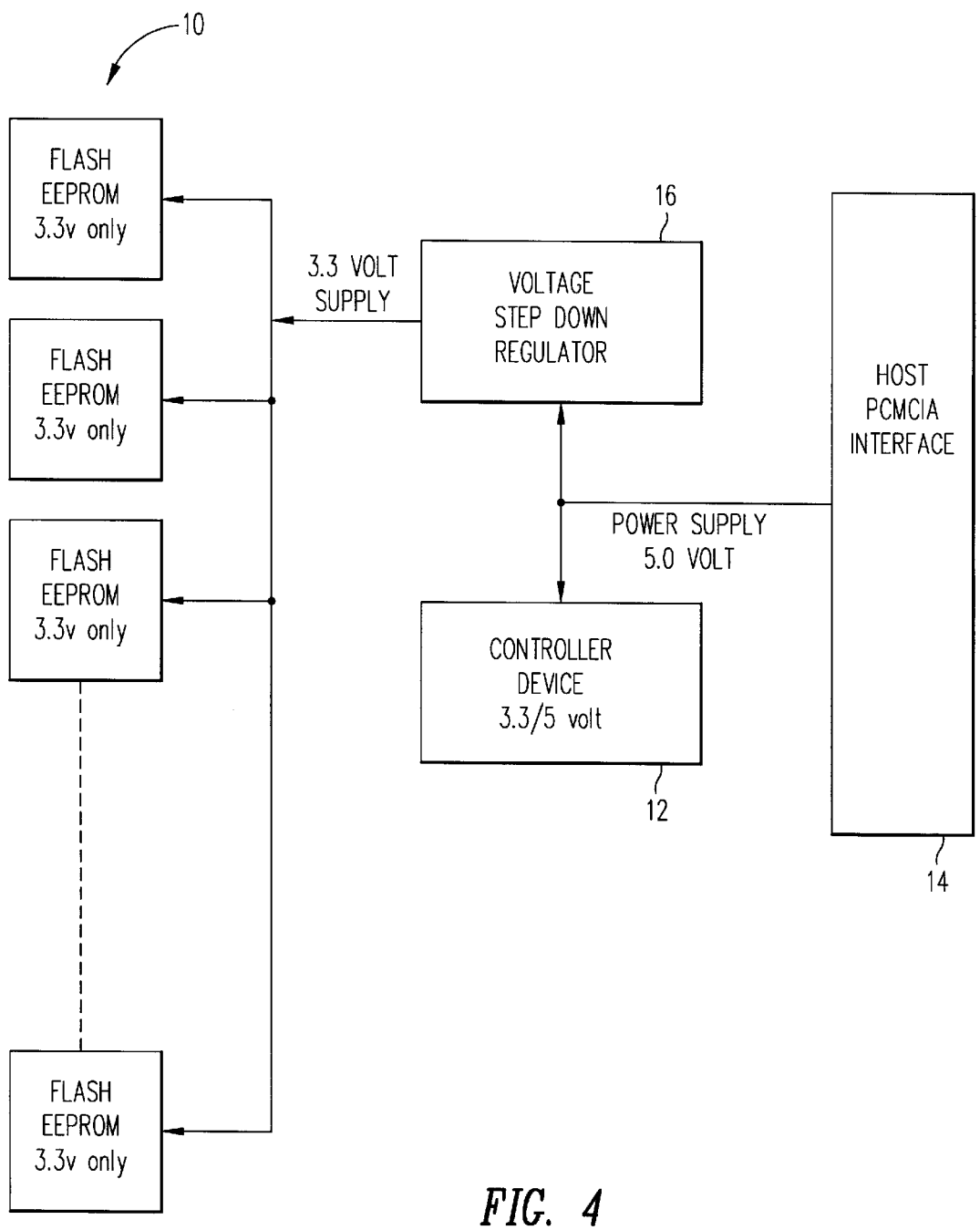
FIG. 4 depicts a block diagram of a PC system employing a prior art PC system having a voltage step-down regulator circuit for converting 5V to 3.3V for use by the Flash EEPROM devices.
Figure 5:
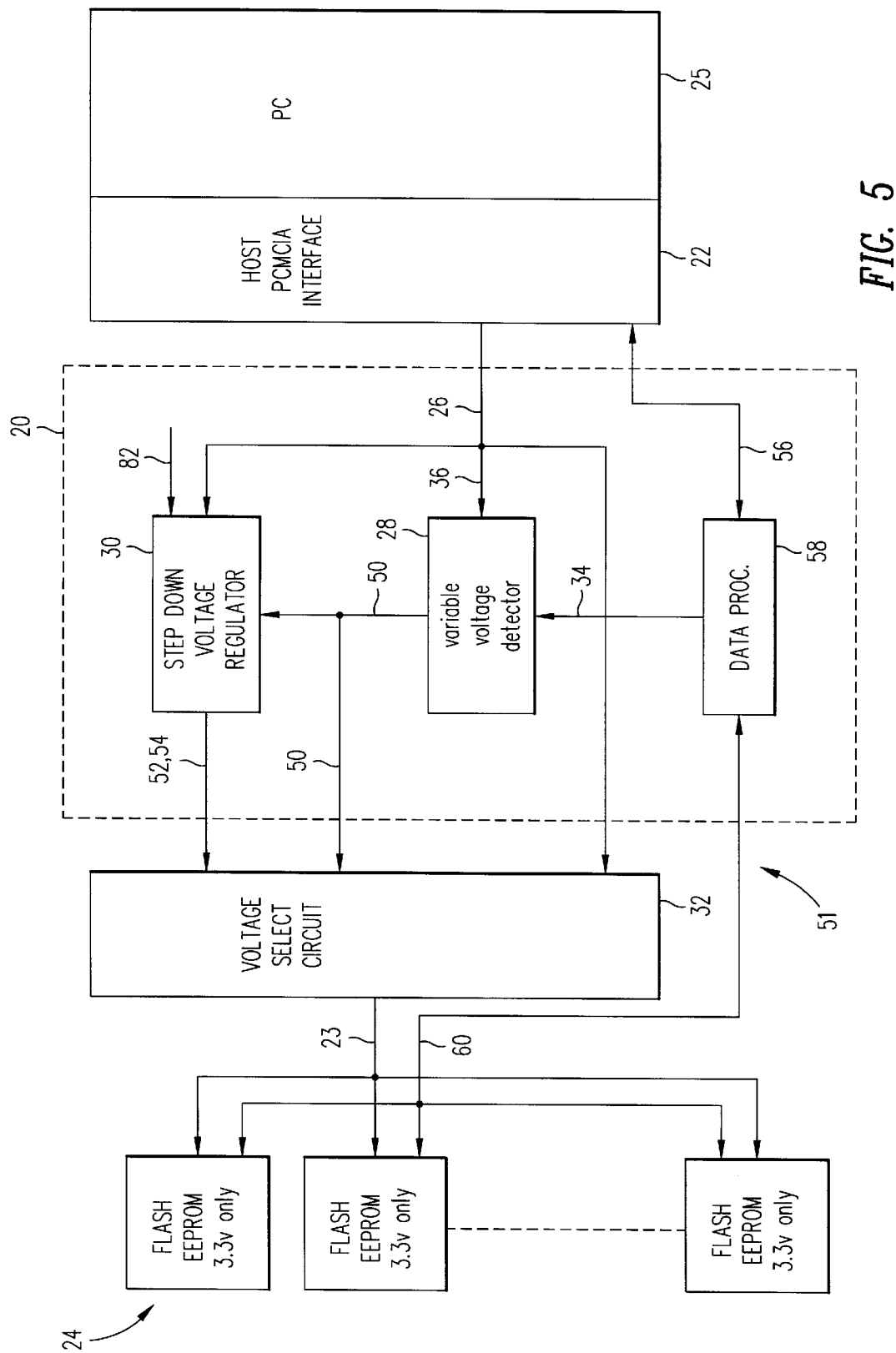
FIG. 5 illustrates a PC card employing a preferred embodiment of the present invention within a controller IC including a step-down voltage regulator, a variable voltage detector and a voltage selector.

Referring now to the drawing, FIG. 5 shows a block diagram of a PC system employing a preferred embodiment of the present invention wherein a controller device 20 is coupled through a host PCMCIA interface 22 and voltage select circuit 32 to a series of Flash EEPROM devices 24. The controller 20 is an IC that generally resides on a PC card (not shown). Voltage select circuit 32 and Flash EEPROM devices 24 also reside on the PC card. The PC card may be inserted into a PC 25 supporting a PCMCIA interface. During the operation of the PC and while the PC card remains inserted therein, the PC card communicates with the host (or CPU) through the host PCMCIA interface 22 to transfer data and command information therebetween. The protocol employed for communication between PC 25 and the PC card is generally defined by the PCMCIA standard, adopted by the industry-at-large.

In a preferred embodiment of the present invention, as shown in FIG. 5, the Flash EEPROM devices 24 operate only at 3.3V. Yet the voltage level of the voltage source 26, provided by the PC 25 through the PCMCIA interface 22 to the PC card may be either at 3.3V or 5V. It is key to the present invention for PC card 20 to be operational when plugged into either a 3.3V or a 5V PC PCMCIA slot such as to maintain proper functionality.

Within the controller 20, resides variable voltage detector 28 to which input voltage 36 is provided from PC 25 through interface 22. In response thereto, voltage detector 28 passes 3.3V-select signal 50 to the step-voltage regulator 30 which also resides within controller 20. Voltage detector 28 is responsive to the enable signal 34, which is generated on the PC card but externally to the controller 20. Enable signal 34 is generated through a commonly-known resistor-capacitor (or RC) circuit when the PC system is powered-on. Initially, it is at logic state "0" and after a particular time delay, determined largely by the resistor and capacitor values of the RC circuit, it takes on logic state "1" Voltage regulator 30 is coupled to the voltage select circuit 32 through signal 52 and feedback signal 54. Voltage select circuit 32 resides within the PC card and externally to the controller 20. The voltage select circuit 32 in turn provides power or voltage source input to the Flash EEPROM devices 24 through the supply input signal 23. Flash EEPROM devices 24 reside externally to, yet on the same PC card as, the controller 20 and the voltage select circuit 32.

Voltage detector 28 enables and disables the voltage regulator 32 in accordance with the voltage level of the input voltage 36 through 3.3V select signal 50, as will be discussed in more detail shortly. Voltage select circuit 32, in response to signals 52 and 54, selects the appropriate voltage level to apply to and furnishes the same to the Flash EEPROM devices 24 through supply input signals 23.

So far, the discussion of FIG. 5 was regarding the way in which the controller, the PC and the Flash EEPROMs interconnect with respect to the power-related signals. While this interconnectivity is important to the present invention, it should be obvious to those skilled in the art that the reason for having power connectivity is to allow the transfer of data between the PC 25, through the controller 20 and to the Flash EEPROM devices 24. This path is generally shown by 51 in FIG. 5 where PC 25, through the host PCMCIA interface 22, transfers data or user information, as well as command information, through data bus 56 to data processor 58. Responsive thereto, data processor 58 processes the data by performing functions such as formatting, error correction coding and command decoding operations, thereafter transferring the processed data through Flash data bus 60 to the Flash EEPROM devices 24. Buses 56 and 60 each comprise multiple signal lines for transferring multiple lines of information in a parallel fashion as is commonly done in the industry in order to expedite information transfers.

Figure 6:
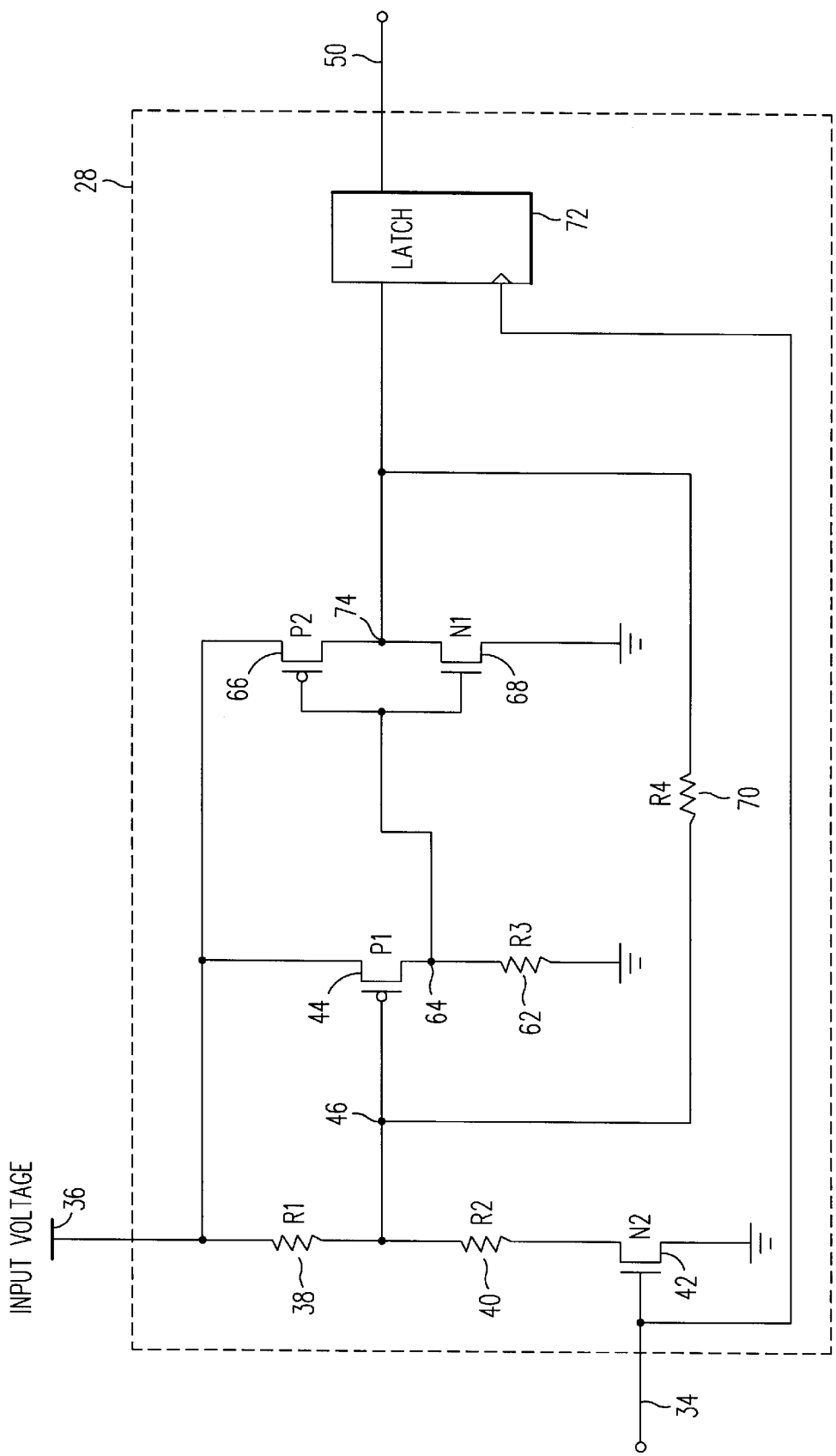
FIG. 6 shows a detailed drawing of the variable voltage detector shown in FIG. 5.

FIG. 6 further details the circuitry included within voltage detector 28. Input voltage 36 is provided as input to the voltage detector 28 through the host PCMCIA interface 22 (in FIG. 5) and enable signal 34 is generated within controller 20, as previously discussed. Referring now to FIG. 6, R1 resister 38 is connected through one of its terminals to input voltage 36 and through its second terminal to R2 resister 40 where node 46 is formed. R2 resister 40 is also connected through its second terminal to the source terminal of N2 transistor 42 which connects, through its drain terminal, to ground (0V). The gate terminal of N2 transistor 42 is connected to enable signal 34. P1 transistor 44, which is a PMOS transistor, is connected at its gate terminal to node 46. P1 transistor 44 connects to input voltage 36 through its source terminal. The drain terminal of P1 transistor 44 forms node 64 and is connected to the first terminal of R3 resistor 62.

Node 64 is further connected to the gate terminals of P2 transistor 66 and N1 transistor 68. P2 and N1 transistors, 66 and 68, collectively act as an inverter switching circuit. When activated, this inverter circuit inverts the state of node 64, which then appears at node 74. Thus, when node 64 is at logic state "1", node 74 will be at logic state "0" and when node 64 is at logic state "0", node 74 will be at state "1". The drain terminal of transistor 68 is connected to ground and its source terminal is connected to the drain terminal of P2 transistor 66 to form node 74. The source terminal of P2 transistor 66 is connected to input voltage 36. Node 74 is further connected to the first terminal of R4 resistor 70, and the second terminal of R4 resistor 70 is connected through a feedback path to node 46. Through R4 resistor 70, this feedback path improves the logic state of node 46 thereby preventing fluctuations during sampling of node 74 by latch 72.

Node 74 additionally provides input to the data input terminal of latch 72. Latch 72 is basically a sample and hold circuit in that when enable signal 34 (provided as input to the enable input of latch 72) is at logic state "1", the output of latch 72 reflects the state of its input or node 74; this is commonly referred to as "sampling". When enable signal 34 is at logic state "0", the output of latch 72 maintains the most recent value at its data input during sampling; this is referred to as "holding". The output of latch 72 generates 3.3V-select signal 50. As will be shortly apparent, a logic state "1" carried on the 3.3V select signal 50 indicates that input voltage 36 is a 3.3V±% 10 voltage source and a logic state "0" indicates that input voltage 36 is a 5V±% 10 voltage source.

As is obvious to those of ordinary skill in the art, N2 transistor 42 and N1 transistor 68 are NMOS-type of transistors while P1 transistor 44 and P2 transistor 66 are PMOS-type transistors. Voltage detector 28 takes advantage of the PMOS transistor characteristics to detect the supply voltage value as will be evident shortly. The resistance values of R1 and R2 resistors, 38 and 40, are selected such that the ratio of their values determines the voltage applied to the gate terminal of the P1 transistor 38. This voltage is higher when the system supply voltage, and therefore the input voltage 36, is 5V as opposed to 3.3V. The ratio of R1 and R2 resistors is accordingly selected in such a way as to force P1 transistor 44 to be in the "on" mode when the supply voltage or input voltage 36 is 5V±10% and in the "off" mode when the supply voltage is at 3.3V±10%. The P2 transistor 66 and N1 transistor 68 are tuned to trigger at a voltage level determined by when the P1 transistor 44 is marginally in the "off" or marginally in the "on" mode in order to ensure that any variance in the supply voltage does not cause the latch 72 to generate an erroneous result through the 3.3V-select signal 50. Stated differently, the ratio of P1 transistor 44 to the R3 resistor 62 is chosen such that when the P1 transistor 33 is marginally "on", node 64 takes on logic state "1" and when the P1 transistor 44 is in the "off" mode, mode 64 will be at logic state "0".

Upon initialization or power-on of the PC system, the PC system's power supply (not shown) is generally in an unstable state, and signals or voltage levels generated by the system are unknown. During this unstable state, the voltage detector shown in FIG. 6 is active and the enable signal 34 is also enabled (or active) and at logic state "1" in the preferred embodiment. The N2 transistor 42 is "on" ensuring that the resistor-divider circuit comprising R1 and R2, 38 and 40, is active. During system power-on, latch 72 is sampling and thereby capturing the state of the input voltage 36 through the P2 transistor 66 and the N1 transistor 68 because enable signal 34 is active or at logic state "1".

While the enable signal 34 is active, the N2 transistor 42 is in the "on" mode and the node 46 provides the appropriate voltage level based upon the predetermined ratio of the R1 and R2 resistors (as discussed previously) to either turn the P1 transistor 44 "on" or "off". That is, if the supply voltage or input voltage 36 is 5.0V±10%, the P1 transistor 44 will be placed in the "on" mode and the 3.3V select signal 50 will be at logic state "0". If the input voltage is 3.3V±10%, the P1 transistor 44 will be in the "off" mode and the 3.3V select signal 50 will be at logic state "1".

After the power supply stabilizes and the state of the input voltage 36 (coming from the power supply) has been captured by latch 72, the enable signal 34 is inactivated (in this case meaning that the enable signal is driven to a low voltage level) by the controller 20 (in FIG. 5). The enable signal 34, being in its inactive state, maintains the captured or sampled voltage level provided by the output of the P2 transistor 66 and the N1 transistor 68 at node 74. The voltage level at node 74 is the detected voltage level of the state of the input voltage 36 (or system supply voltage). Therefore, the detected voltage level provided at node 74 is captured within latch 72 where a logic state "0" at output 50 represents a 5V supply voltage and a logic state "1" represents a 3.3V supply voltage.

Figure 7:
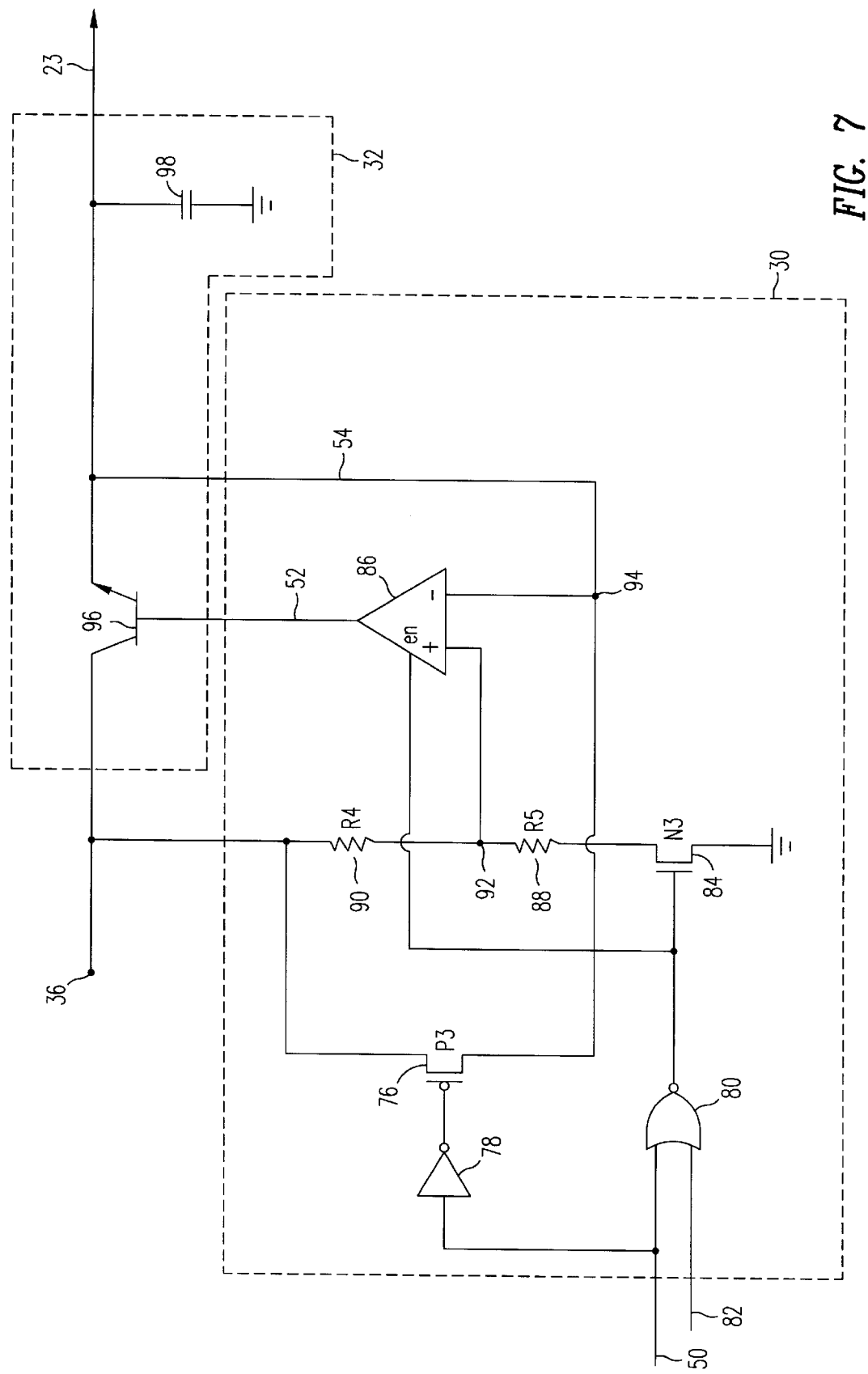
FIG. 7 shows a detailed drawing of the voltage regulator and voltage select circuit of FIG. 5 employed in a preferred embodiment of the present invention.

Turning now to FIG. 7 of the drawing, a detailed schematic of the voltage regulator 30 and voltage select logic 32 is shown. The voltage regulator includes P3 transistor 76 which receives input to its gate terminal from the inverted version of the 3.3V-select signal 50, through inverter 78. P3 transistor 76 additionally receives input to its source terminal from the input voltage 36. Inverter 78 is responsive to the 3.3V-select signal 50 and its output is connected to both the gate terminal of P3 transistor 76 and to a first input of the two-input NOR gate 80. Connected to the second input of NOR gate 80 is regulator_PD signal 82. Regulator_PD signal 82 is generated within controller 20 either when a power down command is instructed by the PC 25 through interface 22 and data bus 56 to data processor 58 or when controller 20 decides to power down due to lack of processing activity in order to save system power. NOR gate 80 in turn, provides input to the enable input of op amp 86 and to the gate terminal of the N3 transistor 84 and the drain terminal of the N3 transistor 84 is connected to ground. The source terminal of the N3 transistor 84 is connected to one of the terminals of the R5 resistor 88 and the second terminal of the R5 resistor 88 is connected to one of the terminals of the R4 resistor 90 at node 92 which provides input to the positive input of the op amp 86. The negative input terminal of the op amp 86 is connected to the drain terminal of the P3 transistor 76 at node 94. The second terminal of the R4 resistor 90 is connected to the input voltage 36.

As earlier discussed, voltage regulator 30 is coupled to the voltage select circuit 32. Voltage select circuit 32 includes bipolar transistor 96 and capacitor 98. Voltage select circuit 32 receives input voltage 36, which connects to the emitter terminal of the bipolar transistor 96. The base terminal of the bipolar transistor 96 is connected to the output terminal of the op amp 86. The emitter terminal of the bipolar transistor 96 connects to one of the terminals of the capacitor 98 and generates the supply input signal 23. The second terminal of the capacitor 98 is connected to ground.

During operation of a PC system employing the preferred embodiment of the present invention wherein 5V is provided through the input voltage 36, the P3 transistor 76 will be in an 'off' mode because the 3.3V-select signal 50 will be at logic state "0" causing the output of inverter 78 to be at logic state "1". Since regulator_PD signal 82 is also at logic state "0", the output of the NOR gate 80 will be at logic state "1" thereby enabling the N3 transistor 84 and the op amp 86. Enabling N3 transistor 84 engages the resister-divider circuit comprising R4 resistor 90 and R5 resistor 88. Based upon the appropriate ratios of resistance values assigned to each of these resistors, the 5V appearing on input voltage 36 is divided to provide 3.3V at node 92. The output of op amp 86, which is 52 drives the gate terminal of the bipolar transistor 96 to provided a divided-down voltage level to the Flash EEPROM devices through the transistor 96 and supply input signal 23. In this case, the divided down voltage level is 3.3V±% 10 while the input voltage 36 maintains a 5V voltage level. The feedback path 54 ensures that the supply input signal 23 remains at 3.3V and capacitor 98 reduces noise and glitches on supply signal 23. In this manner, when 5V is supplied by a PC system using a preferred embodiment of the present invention wherein 3.3V Flash EEPROM devices are employed, the input voltage 36 (which is at 5V) is divided down to 3.3V and provided to the Flash EEPROM devices 24 (in FIG. 5) by the voltage regulator 30 and the voltage select circuit 32 (shown in FIG. 7).

When the input voltage 36 carries 3.3V, the 3.3V-select signal 50 is at logic state "1" driving the output of the NOR gate 80 to logic state "0", thereby disabling both op amp 86 and bipolar transistor 96. The N3 transistor 84 is additionally in an "off" mode causing the resistor-divider circuit comprising R4 resistor 90 and R5 resistor 88 to be disabled. Thus, op amp 86 will be in the 'off' mode because its enable input terminal will be at a logic state of '0'. Since the latter resistor-divider is disabled, no division of the input voltage 36 is performed. Turning the op amp 86 "off", prevents the bipolar transistor 96 from passing the input voltage 36 through to the supply signal 23. Rather, the input voltage 36 will be passed onto the P3 transistor 76 which is in the "on" mode due to the state of the 3.3V select signal 50 being at logic state '1'. The input voltage 36 which will carry 3.3V will be passed through P3 transistor 76 to node 94 and path 54 to generate supply input signal 23. Supply input signal 23 operates to provide the Flash EEPROM devices with 3.3V. In this respect, having the op amp 86, the resistor-divider and the bipolar transistor 96 disabled, during 3.3V operations, the preferred embodiment promotes power efficiency and in fact, saves overall power consumption by the PC system.

In an alternative embodiment, takes advantage of the inability of the Flash EEPROM devices to perform read, write and erase operations effectively when provided with an input supply voltage that they were not designed to perform under. This is done by exposing the Flash EEPROM to their maximum specified operating voltage level. At system power-on and upon resetting the system, the controller 20 in FIG. 5 enables the voltage regulator 30 by setting the regulator_PD signal 82 to logic state '0' and allows the output of the voltage select circuit 32, supply input signal 23, to be the supply voltage to the Flash EEPROM devices. The 5V-select signal 50 is forced high selecting 5V operation. Controller 20 then initiates erase, write and read operations on data to and from the Flash EEPROM devices. In this mode of operation, if the power supply from the PC system is 5.0V±10%, the voltage regulator 30 provides the appropriate voltage level, i.e. 3.3V±10%, to the Flash EEPROM devices. When the controller 20 attempts to perform functional operations such as read, write or erase operations on the data being stored in the Flash EEPROM devices at the maximum specification, the Flash EEPROM devices should function correctly. Therefore, the controller 20 enables the voltage regulator 30 at all times and selects through the voltage select circuit 32, the supply input signal 23 to be the power supply or voltage source to the Flash EEPROM devices 24.

When the PC system's power supply is at 3.3V±10%, the output of the voltage regulator 30 and select circuit 32, as provided by signal 23, will be lower than the Flash EEPROM devices' operational voltage (or 3.3V±10%). In this respect, when the controller 20 attempts to perform functional operations such as read, write and erase on the data stored in the Flash EEPROM devices 24 at maximum specification, these operations will be unsuccessful and the controller 20 will deselect the voltage divider function of the voltage regulator and allow the voltage level supplied by the PC system to input voltage 36 (3.3V±10%) to be applied to the Flash EEPROM devices 24. The controller 20 then resumes functional operation testing to read, write and/or erase data in the Flash EEPROM until these operations return successful results. In this manner, the controller 20 determines that the voltage provided by the system is 3.3V±10% and that therefore no voltage step-down by the voltage regulator 30 is necessary. It should be noted that performance of this alternative embodiment is highly dependent on the operational specification and performance of the Flash EEPROM devices. That is, if these devices are successfully operational at a wide range of input voltage where there is overlap for example from operations voltage of 5V onto 3.3V, this approach may not be optimal. On the other hand, if operational voltages of the Flash devices used do not overlap, this approach is highly feasible.

Although the present invention has been described in terms of specific embodiments it is anticipated that alterations and modifications thereof will no doubt become apparent to those skilled in the art. It is therefore intended that the following claims be interpreted as covering all such alterations and modifications as fall within the true spirit and scope of the invention.

What we claim is:

1. A removable controller card for use in a computer system having a computer and an interface for connecting the computer to the removable controller card and for communicating digital information including power supply input and data between the computer and the card, the card comprising:

non-volatile storage devices including at least one Flash memory device responsive to a memory power supply voltage input for causing the Flash memory device to perform functional data operations; and a controller including, a voltage detector responsive to the power supply input having a predetermined voltage level and operative to generate a voltage selection signal, said voltage detector for detecting the voltage level of the power supply input;

a voltage regulator responsive to said voltage selection signal and said power supply input and operative to divide the voltage level of the power supply input to a step-down voltage level, said voltage regulator further operative to provide said memory power supply voltage input having a voltage level representative of either the voltage level of said power supply input or said step-down voltage level based upon the appropriate voltage level required for use by the Flash memory device to successfully perform functional data operations.

2. A removable controller card as recited in claim 1 wherein said power supply input voltage level is 5V±10% and said step-down voltage level is 3.3V±10%.

3. A removable controller card as recited in claim 2 wherein said voltage detector includes a first resistor-divider circuit coupled to receive said power supply input, said resistor-divider circuit including at least two resistors for selectively dividing the power supply input voltage level and operative to generate a step-down voltage level signal.

4. A removable controller card as recited in claim 3 wherein said voltage detector includes a power-down transistor switch coupled to said first resistor-divider circuit for enabling said first resistor-divider circuit during power-on of the PC system to allow detection of the voltage level of the power supply input and disabling said first resistor-divider circuit after power-on to decrease power efficiency.

5. A removable controller card as recited in claim 4 wherein said voltage detector includes switching circuit coupled to said power supply input and operative to generate said voltage selection signal.

6. A removable controller card as recited in claim 5 wherein said switching circuit includes a first PMOS transistor coupled to receive said power supply input and said first step-down signal and operative to provide a first voltage switching signal, said switching circuit further including an inverter switching circuit responsive to said power supply input and operative to generate said voltage selection signal.

7. A removable controller card as recited in claim 6 wherein said inverter switching circuit further includes a second PMOS transistor responsive to said power supply input and said first voltage switching signal and coupled in-series with an NMOS transistor for generating said voltage selection signal, said NMOS transistor further responsive to said first voltage switching signal.

8. A removable controller card as recited in claim 7 wherein said switching circuit further includes a select storage device and operative to generate said voltage selection signal.

9. A removable controller card as recited in claim 8 further including a voltage selection circuit comprising a capacitor having a first terminal coupled to a bipolar switching transistor responsive to said power supply input and an op-amp output signal operative to generate said memory power supply voltage input, said second terminal of said capacitor being coupled to ground.

10. A removable controller card as recited in claim 9 wherein said voltage regulator includes a second resistor-divider circuit coupled to receive said power supply input, said resistor-divider circuit including at least two resistors for dividing the power supply signal voltage level and operative to generate a second step-down voltage reference level.

11. A removable controller card as recited in claim 10 wherein said voltage regulator further includes an operational amplifier coupled to said second resistor-divider circuit and operative to generate said op-amp output signal.

12. A removable controller card as recited in claim 11 wherein said voltage regulator is further responsive to a power-down signal for disengaging said operational amplifier and said second resistor-divider circuit when the card initiates a power-down operation.

13. In a computer system having a computer and an interface for connecting the computer to a removable controller card to communicate digital information including power supply input and data between the computer and the card, the PC card including a controller for processing the digital information and providing the same to Flash EEPROM storage devices for storing the data therein, a method of detecting the voltage level of the power supply input and selecting to provide the power supply input or a divided power supply input based upon the power supply input being divided in voltage to generate a memory supply input for use by the Flash EEPROM device comprising:

receiving the power supply input from the computer through the interface, the power supply input having a predetermined voltage level;

detecting the predetermined voltage level of the power supply input and, in response thereto, generating a voltage selection signal;

dividing the detected voltage level to generate a step-down voltage level; and selecting between the voltage level of the power supply input and the step-down voltage level thereby generating the memory supply input to allow the Flash devices to perform functional operations successfully on the data.

14. In a computer system having a computer, an interface for communicating data and power source information including a power supply input from the computer to a controller, at least one Flash memory device for storage the data therein, a method of detecting the voltage level of the power supply input by the controller and determining to provide the power supply input or a divided power supply input to the Flash memory device for performing functional operations on the data comprising:

provide the power supply input to the controller from the PC through the interface;

dividing the provided power supply input by a predetermined value to generate a step-down voltage level;

providing the step-down voltage level to the Flash device;

performing functional operations including reading, writing and erasing the data and upon successful results of the functional operations, continuing to provide the step-down voltage level to the Flash device; and upon unsuccessful results of the functional operations, providing the power supply input to the Flash device.

* * * * *